(12) United States Patent
Shi et al.

(10) Patent No.: US 11,569,410 B2
(45) Date of Patent: Jan. 31, 2023

(54) LIGHT EMITTING DIODE PACKAGING DEVICE

(71) Applicant: QUANZHOU SANAN SEMICONDUCTOR TECHNOLOGY CO., LTD., Quanzhou (CN)

(72) Inventors: Junpeng Shi, Xiamen (CN); Juwei Lee, Xiamen (CN); Chen-Ke Hsu, Xiamen (CN)

(73) Assignee: Quanzhou Sanan Semiconductor Technology Co., Ltd., Nanan (CN)

( * ) Notice: Subject to any disclaimer, the term of this patent is extended or adjusted under 35 U.S.C. 154(b) by 187 days.

(21) Appl. No.: 17/086,673

(22) Filed: Nov. 2, 2020

(65) Prior Publication Data
US 2021/0050473 A1 Feb. 18, 2021

Related U.S. Application Data

(63) Continuation-in-part of application No. PCT/CN2018/121265, filed on Dec. 14, 2018.

(51) Int. Cl.
| | |
|---|---|
| *H01L 33/00* | (2010.01) |
| *H01L 25/075* | (2006.01) |
| *H01L 33/48* | (2010.01) |
| *H01L 33/60* | (2010.01) |

(52) U.S. Cl.
CPC ........ *H01L 33/005* (2013.01); *H01L 25/0753* (2013.01); *H01L 33/483* (2013.01); *H01L 33/60* (2013.01); *H01L 2933/0058* (2013.01)

(58) Field of Classification Search
CPC ... H01L 25/0753; H01L 33/483; H01L 33/60; H01L 2933/0058
See application file for complete search history.

(56) References Cited

U.S. PATENT DOCUMENTS

| | | | | |
|---|---|---|---|---|
| 2015/0311405 | A1* | 10/2015 | Oyamada | H01L 33/36 438/27 |
| 2016/0274248 | A1* | 9/2016 | Hasegawa | G02B 5/0891 |
| 2017/0084785 | A1* | 3/2017 | Lee | H01L 33/20 |
| 2018/0323357 | A1* | 11/2018 | Hayashi | H01L 33/486 |

FOREIGN PATENT DOCUMENTS

CN 102148317 A 8/2011

OTHER PUBLICATIONS

Search Report Issued to PCT Application No. PCT/CN2018/121265 by the WIPO dated Aug. 28, 2019.

* cited by examiner

*Primary Examiner* — Jay C Chang
*Assistant Examiner* — Mikka Liu
(74) *Attorney, Agent, or Firm* — Rosenberg, Klein & Lee

(57) ABSTRACT

An LED packaging device includes a frame including a bottom wall having a bottom surface and a surrounding wall extending upwardly from the bottom wall, at least one LED chip, a plurality of spaced-apart reflectors and a packaging body. The bottom and surrounding walls cooperatively define a mounting space. The surrounding wall has an internal side surface facing the mounting space and a top surface facing away from the bottom surface. The LED chip is disposed on the bottom surface and is received in the mounting space. Each of the reflectors is disposed on a peripheral region of the bottom surface. The packaging body covers the LED chip and the reflectors, such that the LED chip is sealed inside the mounting space.

73 Claims, 8 Drawing Sheets

LIGHT EMITTING DIODE PACKAGING DEVICE

CROSS-REFERENCE TO RELATED APPLICATION

This application is a continuation-in-part (CIP) application of PCT International Application No. PCT/CN2018/121265, filed on Dec. 14, 2018. The entire content of the international patent application is incorporated herein by reference.

FIELD

The disclosure relates to a light emitting diode (LED) packaging device, and more particularly to an LED packaging device having an improved light-emitting efficiency.

BACKGROUND

A light emitting diode (LED) is a solid semiconductor light emitting device with a low voltage, and includes a semiconductor chip serving as a light source. When a forward voltage is applied to the semiconductor chip, carriers in the semiconductor chip will recombine to emit photons for generating light. The LED has now become one of the most popular light sources.

So far, conventional packages for LED devices generally utilize injection molded frames made of a material, such as epoxy molding compound (EMC) or polyphthalamide (PPA). Referring to FIG. 1, a conventional LED packaging device 100 includes a frame 110 having a cup hole that is defined by a bottom wall and a sidewall extending upwardly from the bottom wall, an LED chip 120 and an antistatic element 130 mounted in the bottom wall of the cup hole of the frame 110, and a packaging body 140 covering the LED chip 120 and the antistatic element 130 and sealing the cup hole of the frame 110. The continuous development of LED packaging technique has led to a rapid increase in the luminous efficacy of LED devices. For example, the luminous efficacy of some of the white LED devices can reach to 220 lm/W. In order to achieve higher luminous efficacy, a reflective material might be disposed around the sidewall of the cup hole of the frame.

However, the need to redesign such frame and the requirement to dispose the reflective material around the sidewall of the cup hole of the frame result in high cost and low production rate of the LED devices. Therefore, different size of the LED chips would require different frames, which might reduce application flexibility.

SUMMARY

Therefore, an object of the disclosure is to provide an LED packaging device that can alleviate at least one of the drawbacks of the prior art.

According to the disclosure, the LED packaging device includes a frame including a bottom wall having a bottom surface and a surrounding wall, at least one LED chip, a plurality of spaced-apart reflectors, and a packaging body. The surrounding wall extends upwardly from the bottom wall. The bottom wall and the surrounding wall cooperatively define a mounting space. The surrounding wall has an internal side surface facing the mounting space and a top surface facing away from the bottom surface. The LED chip is disposed on the bottom surface and is received in the mounting space. Each of the reflectors is disposed on a peripheral region of the bottom surface. The packaging body covers the LED chip and the reflectors, such that the LED chip is sealed inside the mounting space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
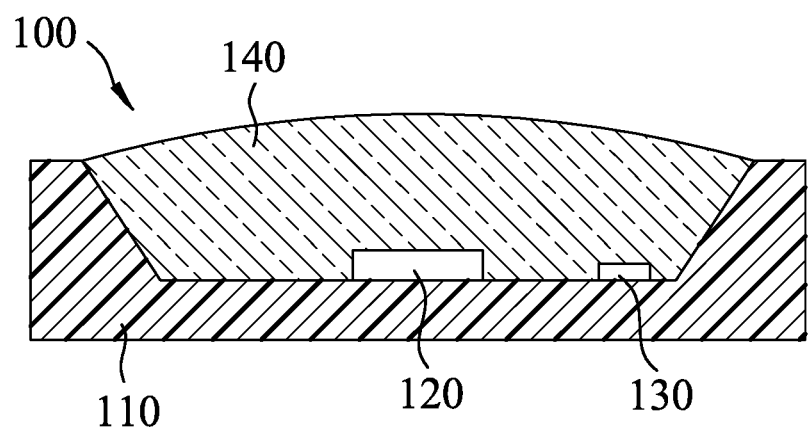
FIG. 1 is a schematic cross-sectional view illustrating a conventional LED packaging device.
Figure 2:
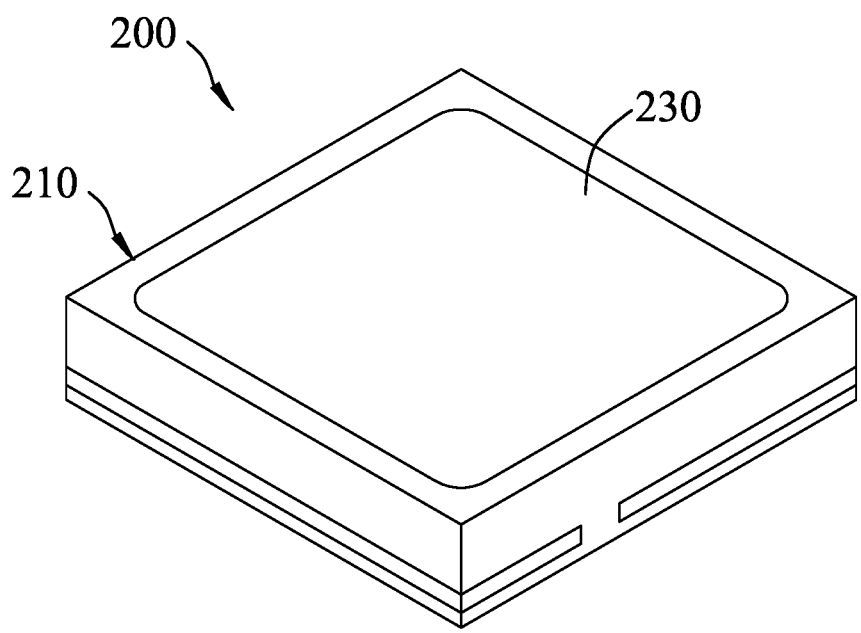
FIG. 2 is a perspective view illustrating a first embodiment of an LED packaging device according to the disclosure.
Figure 3:
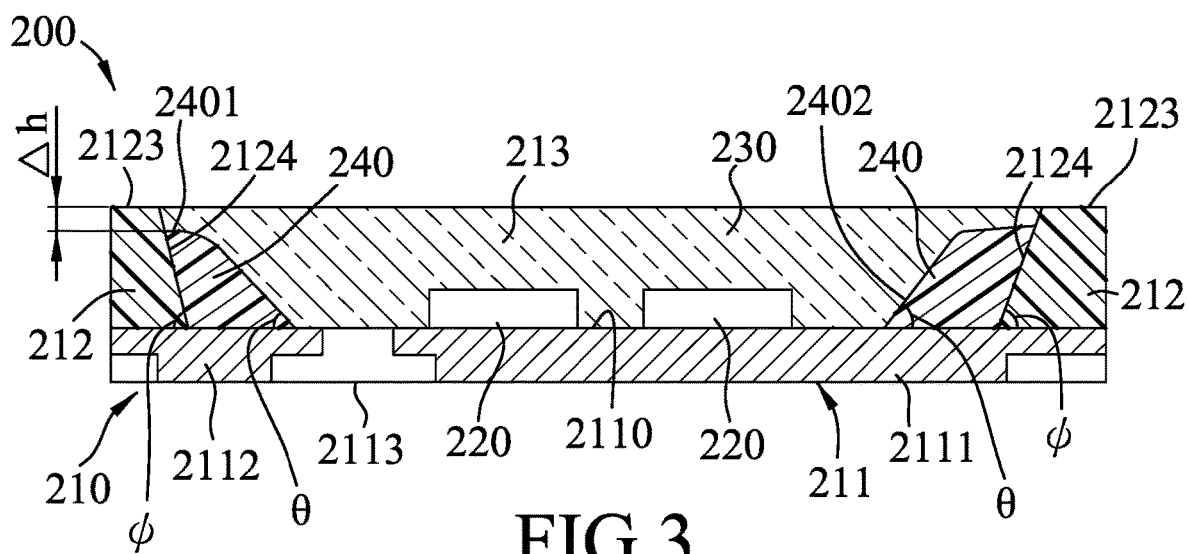
FIG. 3 is a schematic cross-sectional view of the first embodiment.
Figure 4:
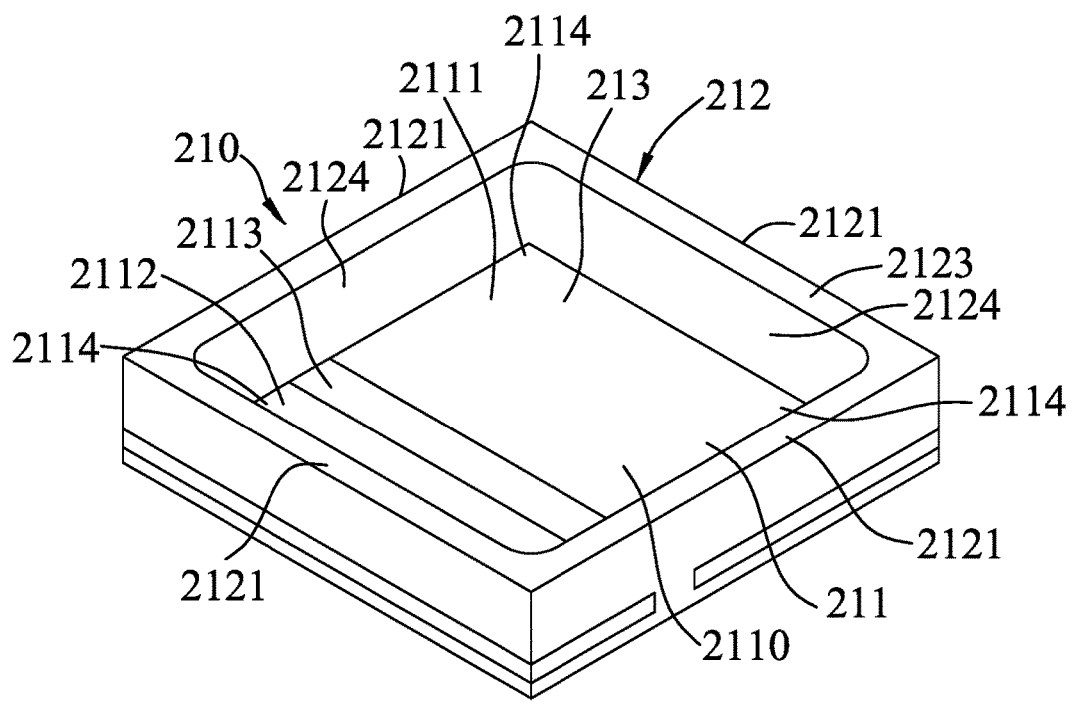
FIG. 4 is a perspective view illustrating a frame of the first embodiment.
Figure 5:
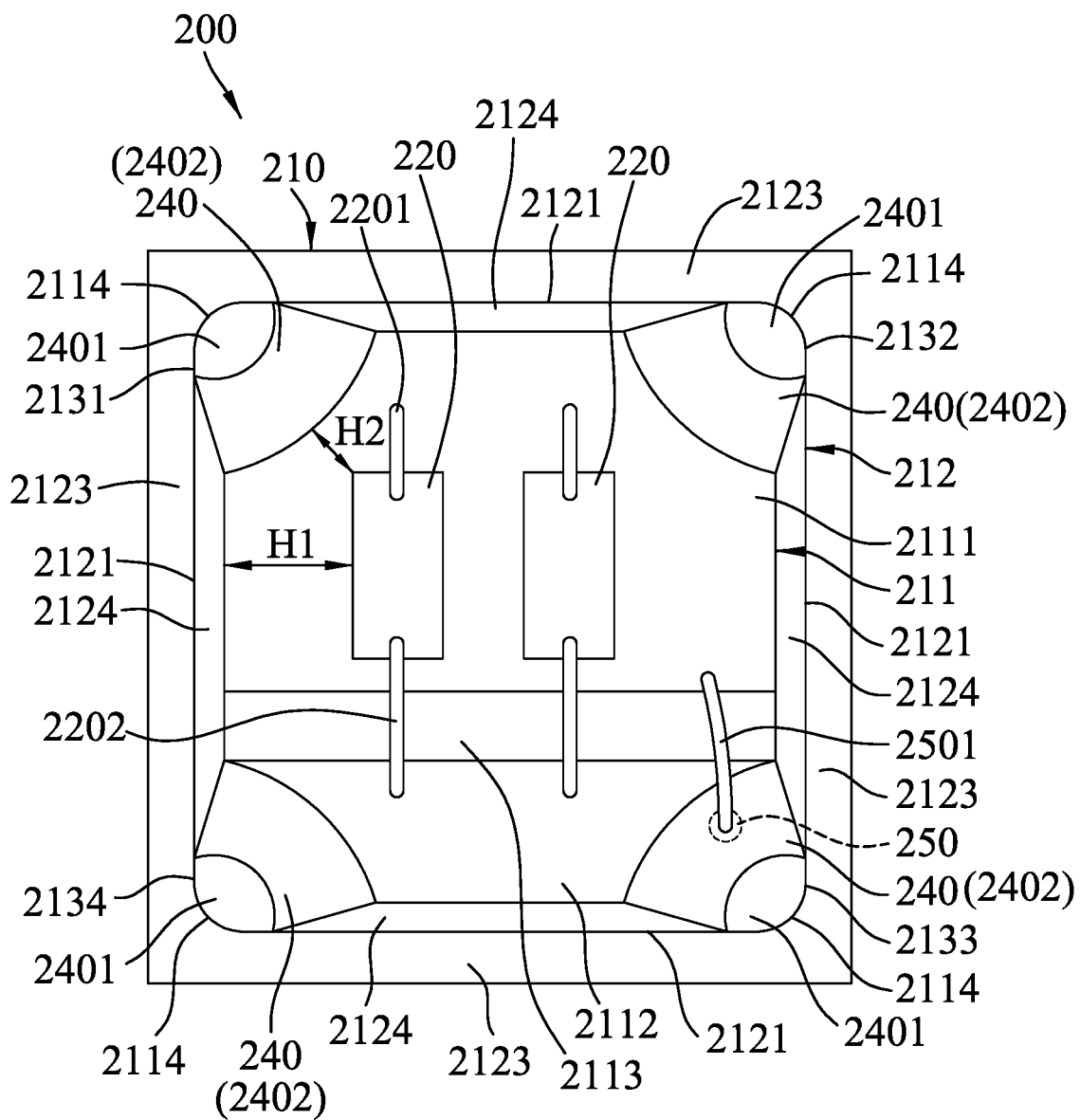
FIG. 5 is a top view of the first embodiment, except that a packaging body is omitted therefrom.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 2 to 5, a first embodiment of an LED packaging device 200 according to this disclosure includes a frame 210, two LED chips 220, a packaging body 230, a plurality of reflectors 240, and leads 2201, 2202, 2501.

The frame 210 includes a bottom wall 211 that has a bottom surface 2110, and a surrounding wall 212 that extends upwardly from the bottom surface 2110 of the bottom wall 211. The frame 210 may be made of a material selected from the group consisting of an epoxy molding compound (EMC), a polyphthalamide (PPA), a poly (1,4-cyclohexylene dimethyleneterephthalate)(PCT), a ceramic material, and combinations thereof. In this embodiment, the frame 210 is made of EMC and has a cup structure. The bottom wall 211 includes a first conductive region 2111 and a second conductive region 2112 that are separated from each other and that are made of a conductive material, and a gap region 2113 that is interconnected between the first and second conductive regions 2111, 2112, and that is made of an insulating material. The first conductive region 2111 has a surface area larger than that of the second conductive region 2112. The bottom surface 2110 of the bottom wall 211 is not subjected to a patterning process, and thus is substantially planar. In certain forms, the bottom surface 2110 has a surface undulation that is not greater than 10 μm.

The bottom wall 211 and the surrounding wall 212 of the frame 210 cooperatively define a mounting space 213. The surrounding wall 212 has an internal side surface 2124 facing the mounting space 213 and a top surface 2123 facing away from the bottom surface 2110. The surrounding wall 212 and the bottom surface 2110 of the frame 210 cooperatively define an interior acute angle (φ) included therebetween which ranges from 45° to 90°. When the interior acute angle (φ) is smaller than 45°, the mounting space 213 thus formed may not be sufficient to mount the LED chips 220 and the leads 2201, 2202, 2501. The internal side surface 2124 has a predetermined reflectance.

The LED chips 220 are disposed on the bottom surface 2110 and received in the mounting space 213. In this embodiment, each of the LED chips 220 is mounted on the first conductive region 2111, and is electrically connected to the first and second conductive regions 2111, 2112 through the leads 2201, 2202. Each of the LED chips 220 may include a first semiconductor layer, a second semiconductor layer, and a light emitting layer disposed between the first semiconductor layer and the second semiconductor layer (not shown in the figure). The first semiconductor layer may be one of a P-type semiconductor layer and an N-type semiconductor layer, and the second type semiconductor layer may be the other one of the P-type semiconductor layer and the N-type semiconductor layer. Each of the LED chips 220 may be a flip-chip LED chip, a vertical LED chip or a horizontal LED chip. When the LED chips 220 are powered and activated through the leads 2201, 2202, a light is emitted from the light emitting layers of the LED chips 220.

Each of the reflectors 240 is disposed on a peripheral region of the bottom surface 2110 of the bottom wall 211. In this embodiment, each of the reflectors 240 is spaced apart from the LED chips 220 on the bottom surface 2110 of the bottom wall 211. The reflectors 240 may be formed by a process selected from the group consisting of dispensing, jetting and screen printing. The packaging body 230 covers the LED chips 220 and the reflectors 240, such that the LED chips 220 are sealed inside the mounting space 213. Each of the reflectors 240 may be in one of a column shape and a bulk shape. The number, location and size of the reflectors 240 may be determined based on the dimension of the mounting space 213 and the distance of the LED chips 220 to the internal side surface 2124 of the surrounding wall 212, such that the total propagation distance of the light emitted from the LED chips 220 in the LED packaging device 200 can be shorten, and the difference of the propagation distances of the light in different directions can be reduced.

In this embodiment, the surrounding wall 212 is in a rectangular shape and has four sidewall parts 2121 interconnected to one another. The frame 210 has four corner regions 2131, 2132, 2133 and 2134 defined by the four sidewall parts 2121 and the bottom wall 211. The LED chips 220 are mounted in a central region of the bottom surface 2110 so that a distance between each of the LED chips 220 and one of the corner regions 2131, 2132, 2133, 2134 is larger than a distance between each of the LED chips 200 and any one of the sidewall parts 2121. The reflectors 240 are disposed at the corner regions 2131, 2132, 2133, 2134 of the frame 210 and are formed by a dispensing process. Each of the reflectors 240 has an upper surface 2401 that is distal from the bottom surface 2110, and has a height measured from the bottom surface 2110 of the bottom wall 211 to the upper surface 2401 which ranges from 5 μm to 2000 μm, such as larger than 10 μm.

In certain embodiments, the height of each of the reflectors 240 is equal to or smaller than a height of the surrounding wall 212 measured from the bottom surface 2110 of the bottom wall 211 to the top surface 2123. For example, the height of each of the reflectors 240 is equal to or greater than two thirds of the height of the surrounding wall 212. In other embodiments, the height of each of the reflectors 240 is equal to or greater than a height measured from the bottom surface 2110 of the bottom wall 211 to the light emitting layer of each of the LED chips 220. For example, the height of each of the reflectors 240 is equal to or greater than a height of each of the LED chips 220. In this embodiment, the height of each of the reflectors 240 is greater than the height of each of the LED chips 220, and is smaller than the height of the surrounding wall 212.

Each of the reflectors 240 may have a reflectance larger than that of the internal side surface 2124 of the surrounding wall 212. In certain embodiments, the reflectance of each of the reflectors 240 is equal to or greater than 90%. In other embodiments, the reflectance of each of the reflectors 240 is equal to or greater than 95%. Each of the reflectors 240 may be made of a material selected from the group consisting of a reflective adhesive (such as a reflective silica gel or a white glue), a reflective resin, and a combination thereof. In certain embodiments, a material for making each of the reflectors 240 is different from that for making the bottom wall 211 and/or that for making the surrounding wall 212. In this embodiment, the reflectors 240 is made of reflective silica gel.

Each of the reflectors 240 is in contact with the internal side surface 2124 and protrudes from the internal side surface 2124 of the surrounding wall 212. Specifically, in this embodiment, each of the reflectors 240 has an inclined surface 2402 connected to and angularly extending from the bottom surface 2110. The inclined surface 2402 and the bottom surface 2110 cooperatively define an interior angle (θ) included therebetween which ranges from 30° to 90°. When the interior angle (θ) is smaller than 30°, the mounting space 213 thus formed would be not sufficient to allow the LED chips 220 and the leads 2201, 2202, 2501 to be mounted therein. To more ensure ample space for chips mounting and lead bonding, the interior angle (θ) may range from 45° to 80°.

In certain embodiments, a footprint of the reflectors 240 on the bottom surface 2110 has an area that ranges from 5% to 60% of the total area of the bottom surface 2110. The footprint of the reflectors 240 is determined according to the position and the number of the LED chips 220. If the footprint of the reflectors 240 is larger than 60% of the total area of the bottom surface 2110, the reflectors 240 occupy too much area of the bottom surface 2110, and thus the remaining space may be not sufficient for chips mounting and lead bonding, and the size of the LED chips may be restrained accordingly, thereby adversely affecting the LED packaging device 200. On the other hand, if the footprint of the reflectors 240 is smaller than 5% of the total area of the bottom surface 2110, it would be difficult to shorten the total propagation path of the light emitted from the LED chips 220 inside the LED packaging device 200, and to increase the luminance efficacy of the LED packaging device 200.

In certain embodiments, each of the reflectors 240 is apart from the nearest one of the LED chips 220 by a first minimum distance (H2), and each of the LED chips 220 is apart from the internal side surface 2124 of the surrounding wall 212 by a second minimum distance (H1). When the first minimum distance (H2) is too short, during formation of the reflectors 240, the material for making the reflectors 240 may affect, e.g., flow and cover, other components disposed on the bottom surface 2110. In addition, a first minimum distance (H2) that is too short may also increase the number of total internal reflection in the LED packaging device 200, and hence the light cannot easily exit therefrom, thereby increasing the light loss. Therefore, the first minimum distance (H2), which is determined according to the size of the LED packaging device 200 and the LED chips 220, may be greater than 50 μm, such as greater than 100 μm (e.g., 100 μm to 500 μm, 500 μm to 1000 μm, 1000 μm to 5000 μm, or 0.5 mm to 10 mm).

Furthermore, the process for making the reflectors 240 may also have an impact on the first minimum distance (H2). If the reflectors 240 are formed by a dispensing process, the size of the reflectors 240 cannot be well controlled, and thus it is desirable to increase the first minimum distance (H2). If the reflectors 240 are formed by a jetting process, the size of the reflectors 240 can be well controlled, and thus the first minimum distance (H2) will be smaller. Moreover, the first minimum distance (H2) may have an influence on the second minimum distance (H1). In certain embodiments, the first minimum distance (H2) ranges from 0.3 to 1.3 times of the second minimum distance (H1). When the first minimum distance (H2) is smaller than 0.3 times of the second minimum distance (H1), the light emitted from the LED chips 220 may be unevenly distributed on a light extraction surface of the LED packaging device 200. When the first minimum distance (H2) is greater than 1.3 times of the second minimum distance (H1), the reflectors 240 have limited adjustment to the optical path of the light emitted from the LED chips 220. In certain embodiments, the first minimum distance (H2) ranges from 0.5 to 1.1 times of the second minimum distance (H1), the optical path of the light emitted from the LED chips 220 can be well-adjusted in the LED packaging device 200 so as to achieve even light extraction, and thus increases the light extraction efficiency of the LED packaging device 200. Under the same first minimum distance (H2), the larger the size of the reflectors 240 is, the greater the light extraction efficiency of the LED packaging device 200 is.

In this embodiment, the frame 210 can be a commercially obtained product, and thus there is no need to redesign the structure thereof and make a new one. By virtue of making the reflectors 240 at the corner regions 2131, 2132, 2133, 2134 of the frame 210 through dispensing or jetting, the reflectors 240 are capable of effectively shortening the total propagating distance of the light emitting from the LED chips 220 and reducing the difference of the propagation distances of the light in different directions, thereby improving the light extraction efficiency of the LED packaging device 200.

The LED packaging device 200 may further include an antistatic element 250 that is configured to protect the LED chips 220 from damage due to a static electricity from an external power source. The antistatic element 250 may be received in the mounting space 213 without exposure to an outer environment. For example, the antistatic element 250 may be disposed on one of the first and second conductive regions 2111, 2112, and may be electrically connected thereto via the lead 2501, and may be covered by the packaging body 230. In this embodiment, the antistatic element 250 is disposed on the peripheral region of the bottom surface 2110 (e.g., at the corner region 2133), and is covered by one of the reflectors 240 such that the light emitted from the LED chips 220 will be indirectly incident on the antistatic element 250.

The top surface 2123 and the internal side surface 2124 of the surrounding wall 212 cooperate with the upper surface 2401 of each of the reflectors 240 to form a step having a height (Δh). That is, the top surface 2123 of the surrounding wall 212 is located at a higher position as compared to the upper surface 2401 of each of the reflectors 240. Specifically, the packaging body 230 of the LED packaging device 200 which is made of a sealing material (such as resin or silica gel) is formed by introducing the sealing material in a liquid state into the mounting space 213 of the frame 210 and then curing the sealing material. Since the top surface 2123 is higher than the upper surface 2401, the surrounding wall 212 can prevent the sealing material from flowing out of the frame 210 during the preparation of the packaging body 230.

According to this disclosure, a method for manufacturing the LED packaging device 200 may include the following steps 1 to 3.

In step 1, the frame 210 is provided. The frame 210 includes the bottom wall 211 that has the bottom surface 2110, and the surrounding wall 212 that extends upwardly from the bottom wall 211 and that cooperates with the bottom wall 211 to define the mounting space 213.

In step 2, at least one LED chip 220 is disposed on the bottom surface 2110 and is received in the mounting space 213. In step 3, a plurality of the spaced-apart reflectors 240 are disposed on a peripheral region of the bottom surface 2110. In certain embodiments, only a portion of the peripheral region of the bottom surface 2110 is covered by the reflectors 240. In should be noted that step 2 may be conducted before or after step 3, and are not particularly limited.

After steps 2 and 3, the packaging body 230 is formed to cover the LED chip 220 and the reflectors 240, such that the LED chip 220 is sealed inside the mounting space 213.

Figure 6:
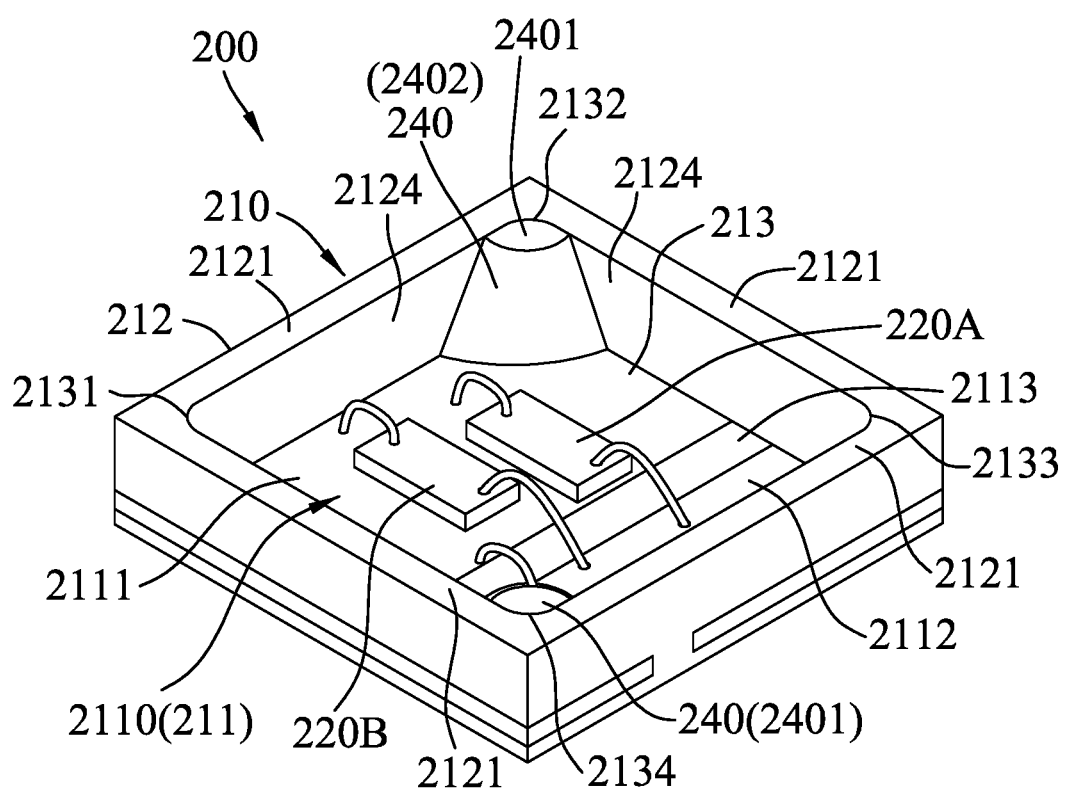
FIG. 6 is a perspective view illustrating a second embodiment of the LED packaging device according to the disclosure, except that the packaging body is omitted therefrom.
Figure 7:
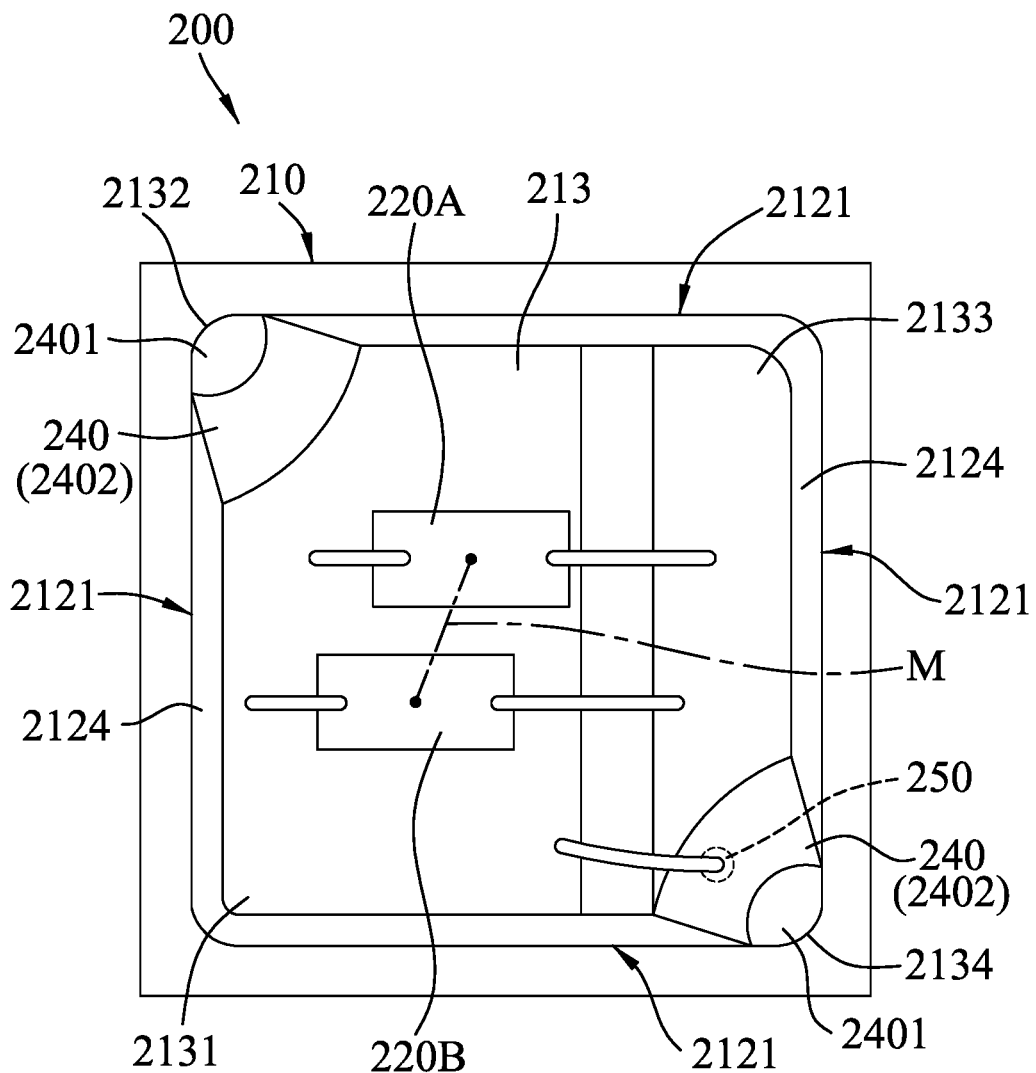
FIG. 7 is a top view of the second embodiment.

Referring to FIGS. 6 and 7, a second embodiment of the LED packaging device 200 according to this disclosure is generally similar to the first embodiment, except that in the second embodiment, two LED chips 220A, 220B, which have a substantially rectangular shape, are disposed on the bottom surface 2110 in a staggered arrangement. That is, a line (M) interconnecting geometric centers of the LED chips 220A, 220B is not perpendicular to or parallel to any edge of the LED chips 220A, 220B. Due to the staggered arrangement, the LED chips 220A, 220B have a difference (D) in distance from the geometric center of each of the LED chips 220A, 220B to one of the sidewall parts 2121. That is, the distances between the geometric center of each of the LED chips 220A, 220B to the one of the sidewall parts 2121 are not the same. In addition, each of the LED chips 220A and 220B has a distance to the corner regions 2132, 2134 that is larger than a distance to the corner regions 2131 and 2133. Thus, in this embodiment, two reflectors 240 are disposed at the corner regions 2132 and 2134, respectively. Moreover, the antistatic element 250 applied in this embodiment is a Zener diode which is disposed at the corner region 2134 and is covered by one of the reflectors 240 made of white glue. With such staggered arrangement of the LED chips 220A, 220B, the light, which is emitted from one of the LED chips 220A, 220B, absorbed by the other one of the LED chips 220A, 220B can be effectively reduced, thereby increasing the light extraction efficiency of the LED packaging device 200.

Figure 8:
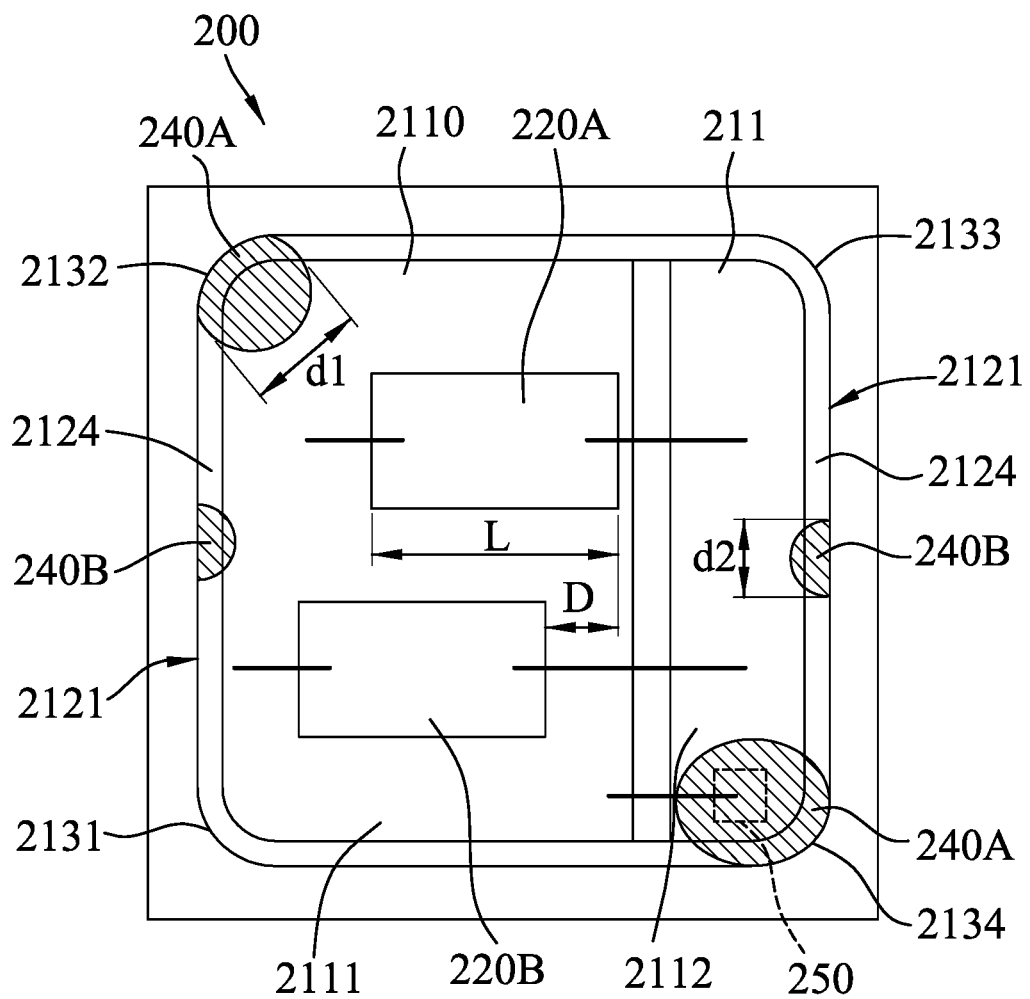
FIG. 8 is a top view illustrating a third embodiment of the LED packaging device according to the disclosure, except that the packaging body is omitted therefrom.

Referring to FIG. 8, a third embodiment of the LED packaging device 200 is generally similar to the second embodiment, except that in the third embodiment, the reflectors 240 include at least one first reflector 240A which is disposed at one of the corner regions 2131, 2132, 2133, 2134, and at least one second reflector 240B which is disposed on the one of the sidewall parts 2121 and which is located between projection points of the geometric centers of the LED chips 220A, 220B on the one of the sidewall parts 2121. Specifically, in the third embodiment, the LED packaging device 200 includes two first reflectors 240A which are respectively disposed at the corner regions 2132, 2134, and two second reflectors 240B which are disposed on two opposite sidewall parts 2121 (e.g., left and right sidewall parts 2121 as shown in FIG. 8) and which are located between projection points of the geometric centers of the LED chips 220A, 220B on a respective one of the sidewall parts 2121. Each of the first and second reflectors 240A, 240B has a contact region that is in contact with the bottom surface 2110 of the bottom wall 211. For each of the first reflector 240A, the contact region thereof has a width (d1), and for each of the second reflector 240B, the contact region thereof has a width (d2). The width (d1, d2) of each of the first and second reflectors 240A, 240B may range from 0.1 to 2 times of the difference (D) in distance from the geometric center of each of the LED chips 220A, 220B to the one of the sidewall parts 2121 (i.e., the right sidewall parts 2121).

The difference (D) in distance of the LED chips 220A, 220B, the width (d1) of each of the first reflectors 240A, and the width (d2) of each of the second reflectors 240B can be optimized according to practical requirements, so as to obtain the LED packaging device 200 with a desired improved light extraction efficiency. In this embodiment, the contact region of each of the first reflectors 240A is larger in area than that of each of the second reflectors 240B. For example, the width (d1) of each of the first reflectors 240A may range from 0.5 to 2 times of the difference (D) in distance, such as from 1.0 to 1.5 times of the difference (D) in distance. The width (d2) of each of the second reflectors 240B may range from 0.1 to 1.0 times of the difference (D) in distance, such as from 0.5 to 1.0 times of the difference (D) in distance.

In addition, the difference (D) in distance may be smaller than half of a length (L) of an edge of one of the LED chips 220A, 220B. When the difference (D) in distance is larger than 0.5 times of the length (L), the space would be not sufficient for lead bonding, thereby adversely affecting the manufacturing process. By virtue of disposing different sizes of the reflectors 240 at different locations, the light extraction efficiency of the third embodiment of the LED packaging device 200 can be further improved.

Figure 9:
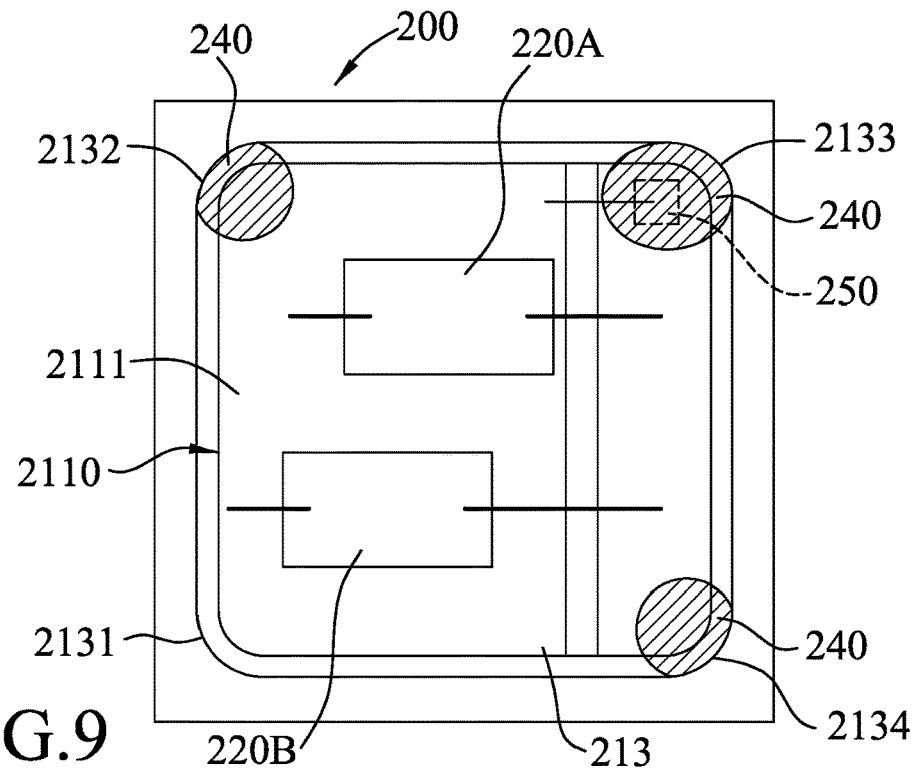
FIG. 9 is a top view illustrating a fourth embodiment of the LED packaging device according to the disclosure, except that the packaging body is omitted therefrom.

Referring to FIG. 9, a fourth embodiment of the LED packaging device 200 according to this disclosure is generally similar to the second embodiment, except that in the fourth embodiment, three of the reflectors 240 are respectively disposed at three of the corner regions 2132, 2133, 2134 which are farther away from the LED chips 220A, 220B than the remaining corner region 2131, and the antistatic element 250 is disposed at the corner region 2133.

It should be noted that although the first to fourth embodiments of the LED packaging device 200 include two LED chips 220, the number of the LED chips 220 can be one or more than two.

Figure 10:
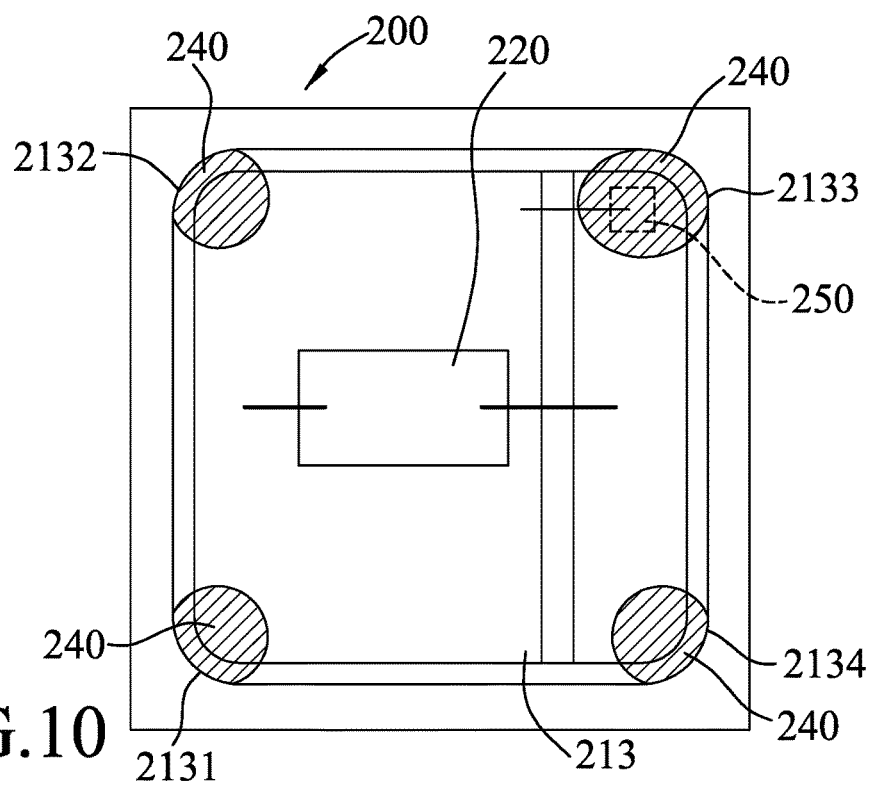
FIG. 10 is a top view illustrating a fifth embodiment of the LED packaging device according to the disclosure, except that the packaging body is omitted therefrom.

Referring to FIG. 10, a fifth embodiment of the LED packaging device 200 according to this disclosure is generally similar to the first embodiment, except that in the fifth embodiment, only one LED chip 220 is disposed on the bottom surface 2110, and four of the reflectors 204 are respectively disposed at four corner regions 2131, 2132, 2133, 2134.

Figure 11:
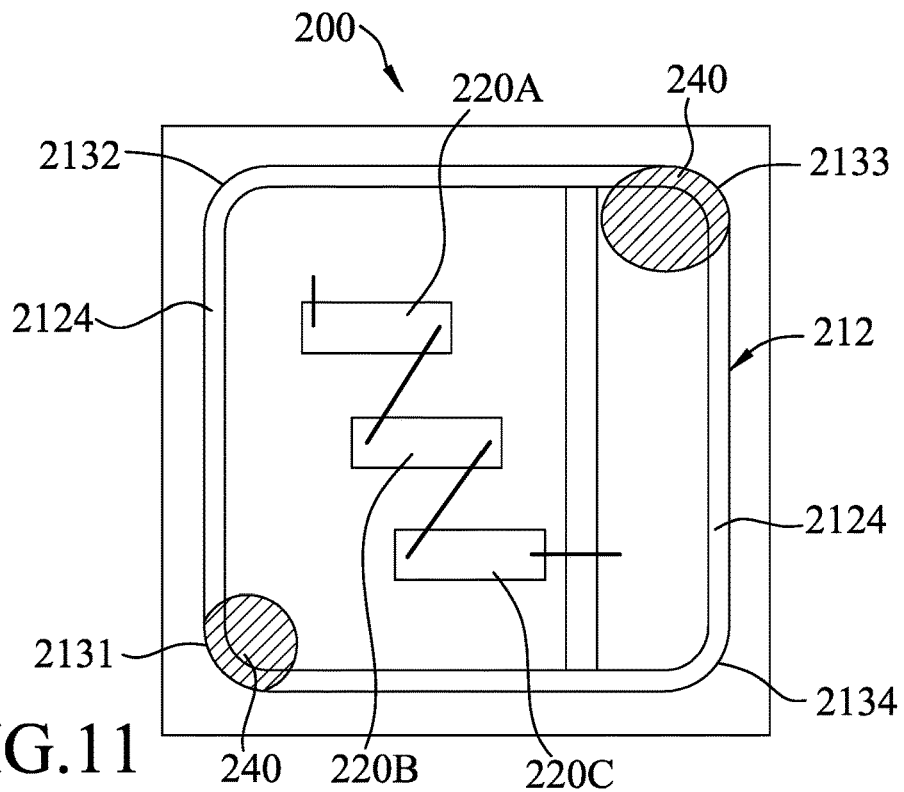
FIG. 11 is a top view illustrating a sixth embodiment of the LED packaging device according to the disclosure, except that the packaging body is omitted therefrom.

Referring to FIG. 11, a sixth embodiment of the LED packaging device 200 according to this disclosure is generally similar to the first embodiment, except that in the sixth embodiment, three LED chips 220A, 220B, 220C are disposed on the bottom surface 2110 in a staggered arrangement, and two reflectors 240 made of white glue are respectively disposed at two diagonal ones of the corner regions 2131 and 2133 which are farther away from the three LED chips 220A, 220B, 220C than the remaining corner regions 2132, 2134. Specifically, the LED chip 220A is positioned nearest to the left sidewall part 2121, and the LED chip 220C is positioned nearest to the right sidewall part 2121 opposite to the left sidewall part 2121. In addition, the antistatic element 250 is omitted from the LED packaging device 200.

Figure 12:
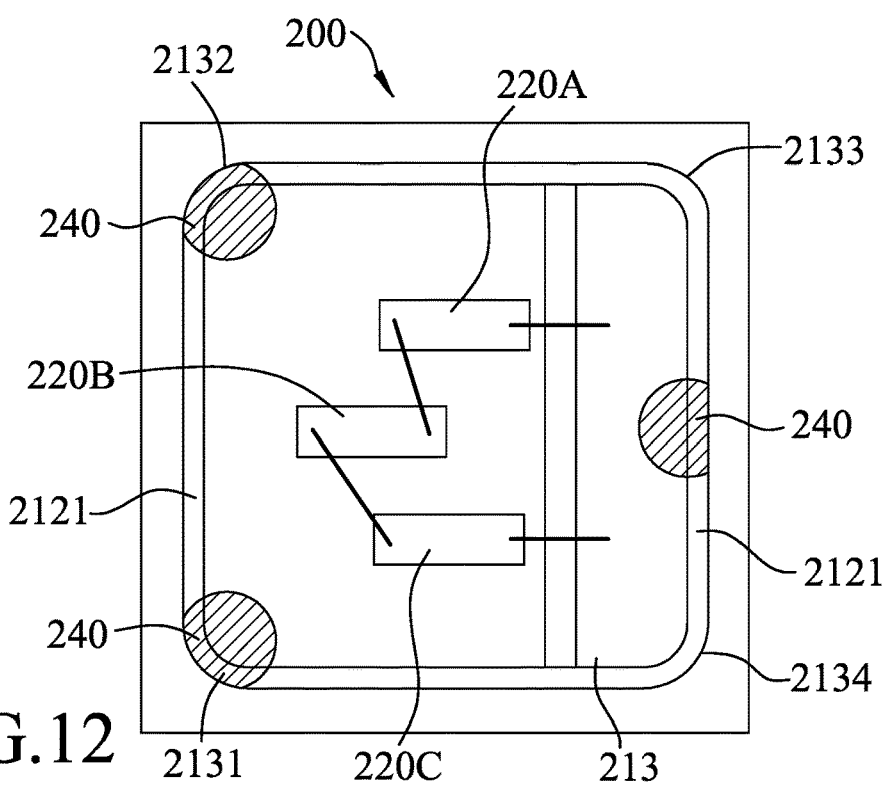
FIG. 12 is a top view illustrating a seventh embodiment of the LED packaging device according to the disclosure, except that the packaging body is omitted therefrom.

Referring to FIG. 12, a seventh embodiment of the LED packaging device 200 according to this disclosure is generally similar to the sixth embodiment, except for the arrangement of the three LED chips 220A, 220B, 220C. Specifically, the LED chip 220B is positioned nearest to the left sidewall part 2121, and the remaining two LED chips 220A, 220C are farther away from the left sidewall part 2121 than the LED chip 220B. In addition, two of three reflectors 240 are respectively disposed at the corner regions 2131, 2132 which are interconnected by the left sidewall part 2121, and one of the three reflectors 240 is disposed on one of the sidewall parts 2121 (i.e., a central region of the right sidewall part 2121).

In conclusion, by spacedly disposing the reflectors 240 on a peripheral region of the bottom surface 2110 of the frame 210, the total propagation distance of the light emitted from the LED chips 220 inside the LED packaging device 200 of this disclosure can be shortened, and the difference of the propagation distances of the light in different directions can also be reduced. As such, the LED packaging device 200 of this disclosure can exhibit an improved light extraction efficiency.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode (LED) packaging device, comprising:
   a frame including a bottom wall that has a bottom surface, and a surrounding wall that extends upwardly from said bottom wall, said bottom wall and said surrounding wall cooperatively defining a mounting space, said surrounding wall having an internal side surface facing said mounting space and a top surface facing away from said bottom surface;
   at least one LED chip disposed on said bottom surface and received in said mounting space;
   a plurality of spaced-apart reflectors, each of which being disposed on a peripheral region of said bottom surface; and
   a packaging body covering said LED chip and said reflectors, such that said LED chip is sealed inside said mounting space,
   wherein each of said reflectors has an upper surface that is distal from said bottom surface, and has a height measured from said bottom surface of said bottom wall to said upper surface that is equal to or smaller than a height of said surrounding wall measured from said bottom surface of said bottom wall to said top surface, and
   wherein said top surface and said internal side surface of said surrounding wall cooperate with said upper surface of each of said reflectors to form a step.

2. The LED packaging device of claim 1, wherein said bottom surface of said bottom wall has a surface undulation that is not greater than 10 μm.

3. The LED packaging device of claim 1, wherein each of said reflectors is in contact with said internal side surface and protrudes from said internal side surface of said surrounding wall.

4. The LED packaging device of claim 1, wherein each of said reflectors has a reflectance larger than that of said internal side surface of said surrounding wall.

5. The LED packaging device of claim 1, wherein each of said reflectors has a reflectance that is equal to or greater than 90%.

6. The LED packaging device of claim 1, wherein the height of each of said reflectors is equal to or greater than two thirds of the height of said surrounding wall.

7. The LED packaging device of claim 1, wherein the height of each of said reflectors ranges from 5 μm to 2000 μm.

8. The LED packaging device of claim 1, wherein said at least one LED chip includes a first semiconductor layer, a second semiconductor layer, and a light emitting layer disposed between said first semiconductor layer and said second semiconductor layer, and wherein the height of each of said reflectors is equal to or greater than a height measured from said bottom surface of said bottom wall to said light emitting layer.

9. The LED packaging device of claim 1, wherein each of said reflectors is made of a material selected from the group consisting of reflective silica gel, reflective resin, and a combination thereof.

10. The LED packaging device of claim 1, wherein each of said reflectors is apart from said LED chip by a first minimum distance which is equal to or greater than 50 μm.

11. The LED packaging device of claim 1, wherein each of said reflectors is apart from said LED chip by a first minimum distance, and said LED chip is apart from said internal side surface of said surrounding wall by a second minimum distance, the first minimum distance ranging from 0.3 to 1.3 times of the second minimum distance.

12. The LED packaging device of claim 1, wherein a footprint of said reflectors on said bottom surface has an area that ranges from 5% to 60% of a total area of said bottom surface.

13. The LED packaging device of claim 1, wherein each of said reflectors is in one of a column shape and a bulk shape.

14. The LED packaging device of claim 1, wherein each of said reflectors has an inclined surface connected to and angularly extending from said bottom surface, said inclined surface and said bottom surface cooperatively defining an interior angle included therebetween which ranges from 30° to 90°.

15. The LED packaging device of claim 1, wherein said reflectors are formed by a process selected from the group consisting of dispensing, jetting and screen printing.

16. The LED packaging device of claim 1, wherein each of said reflectors is made of a material different from that of said bottom wall of said frame.

17. The LED packaging device of claim 1, wherein each of said reflectors is made of a material different from that of said surrounding wall of said frame.

18. The LED packaging device of claim 1, further comprising an antistatic element covered by at least one of said reflectors.

19. The LED packaging device of claim 1, wherein said frame is made of a material selected from the group consisting of an epoxy molding compound (EMC), a polyphthalamide (PPA), a poly(1,4-cyclohexylene dimethylene terephthalate)(PCT), a ceramic material, and combinations thereof.

20. The LED packaging device of claim 1, wherein said at least one LED chip is selected from the group consisting of a flip-chip LED chip, a vertical LED chip, and a horizontal LED chip.

21. The LED packaging device of claim 1, wherein each of said reflectors is spaced apart from said at least one LED chip on said bottom surface of said bottom wall.

22. The LED packaging device of claim 1, wherein said surrounding wall is in a rectangular shape, and said reflectors are disposed at corner regions of said frame.

23. The LED packaging device of claim 22, wherein said LED packaging device comprises two of said LED chips disposed on said bottom surface in a staggered arrangement, said surrounding wall including four sidewall parts interconnected to one another, said LED chips having a difference in distance from a geometric center of each of said LED chips to one of said sidewall parts, each of said reflectors having a contact region contacting said bottom surface of said bottom wall, said contact region having a width ranging from 0.1 to 2 times of the difference in distance.

24. The LED packaging device of claim 1, wherein:
   said surrounding wall is in a rectangular shape,
   said LED packaging device comprises two of said LED chips disposed on said bottom surface in a staggered arrangement, said surrounding wall including four sidewall parts interconnected to one another, said LED chips having a difference in distance from a geometric center of each of said LED chips to one of said sidewall parts, each of said reflectors having a contact region contacting said bottom surface of said bottom wall, said contact region having a width ranging from 0.1 to 2 times of the difference in distance,
   said reflectors include at least one first reflector that is disposed at one of corner regions of said frame, and at least one second reflector that is disposed on said one of said sidewall parts, and that is located between projection points of said geometric centers of said LED chips on said one of said sidewall parts, and said contact region of said at least one first reflector is larger in area than that of said at least one second reflector.

25. The LED packaging device of claim 24, wherein said contact region of said at least one first reflector has a width that ranges from 0.5 to 2 times of the difference in distance.

26. The LED packaging device of claim 24, wherein said contact region of said at least one second reflector has a width that ranges from 0.1 to 1 times of the difference in distance.

27. A light emitting diode (LED) packaging device, comprising:

a frame including a bottom wall that has a bottom surface, and a surrounding wall that extends upwardly from said bottom wall, said bottom wall and said surrounding wall cooperatively defining a mounting space, said surrounding wall having an internal side surface facing said mounting space and a top surface facing away from said bottom surface;

at least one LED chip disposed on said bottom surface and received in said mounting space;

a plurality of spaced-apart reflectors, each of which being disposed on a peripheral region of said bottom surface;

a packaging body covering said LED chip and said reflectors, such that said LED chip is sealed inside said mounting space; and an antistatic element covered by at least one of said reflectors.

28. The LED packaging device of claim 27, wherein said bottom surface of said bottom wall has a surface undulation that is not greater than 10 μm.

29. The LED packaging device of claim 27, wherein each of said reflectors is in contact with said internal side surface and protrudes from said internal side surface of said surrounding wall.

30. The LED packaging device of claim 27, wherein each of said reflectors has a reflectance larger than that of said internal side surface of said surrounding wall.

31. The LED packaging device of claim 27, wherein each of said reflectors has a reflectance that is equal to or greater than 90%.

32. The LED packaging device of claim 27, wherein each of said reflectors has an upper surface that is distal from said bottom surface, and has a height measured from said bottom surface of said bottom wall to said upper surface that is equal to or smaller than a height of said surrounding wall measured from said bottom surface of said bottom wall to said top surface.

33. The LED packaging device of claim 32, wherein the height of each of said reflectors is equal to or greater than two thirds of the height of said surrounding wall.

34. The LED packaging device of claim 32, wherein the height of each of said reflectors ranges from 5 μm to 2000 μm.

35. The LED packaging device of claim 32, wherein said at least one LED chip includes a first semiconductor layer, a second semiconductor layer, and a light emitting layer disposed between said first semiconductor layer and said second semiconductor layer, and wherein the height of each of said reflectors is equal to or greater than a height measured from said bottom surface of said bottom wall to said light emitting layer.

36. The LED packaging device of claim 27, wherein each of said reflectors is made of a material selected from the group consisting of reflective silica gel, reflective resin, and a combination thereof.

37. The LED packaging device of claim 27, wherein each of said reflectors is apart from said LED chip by a first minimum distance which is equal to or greater than 50 μm.

38. The LED packaging device of claim 27, wherein each of said reflectors is apart from said LED chip by a first minimum distance, and said LED chip is apart from said internal side surface of said surrounding wall by a second minimum distance, the first minimum distance ranging from 0.3 to 1.3 times of the second minimum distance.

39. The LED packaging device of claim 27, wherein a footprint of said reflectors on said bottom surface has an area that ranges from 5% to 60% of a total area of said bottom surface.

40. The LED packaging device of claim 27, wherein each of said reflectors is in one of a column shape and a bulk shape.

41. The LED packaging device of claim 27, wherein each of said reflectors has an inclined surface connected to and angularly extending from said bottom surface, said inclined surface and said bottom surface cooperatively defining an interior angle included therebetween which ranges from 30° to 90°.

42. The LED packaging device of claim 27, wherein said reflectors are formed by a process selected from the group consisting of dispensing, jetting and screen printing.

43. The LED packaging device of claim 27, wherein each of said reflectors is made of a material different from that of said bottom wall of said frame.

44. The LED packaging device of claim 27, wherein each of said reflectors is made of a material different from that of said surrounding wall of said frame.

45. The LED packaging device of claim 27, wherein said frame is made of a material selected from the group consisting of an epoxy molding compound (EMC), a polyphthalamide (PPA), a poly(1,4-cyclohexylene dimethylene terephthalate)(PCT), a ceramic material, and combinations thereof.

46. The LED packaging device of claim 27, wherein said at least one LED chip is selected from the group consisting of a flip-chip LED chip, a vertical LED chip, and a horizontal LED chip.

47. The LED packaging device of claim 27, wherein each of said reflectors is spaced apart from said at least one LED chip on said bottom surface of said bottom wall.

48. The LED packaging device of claim 27, wherein said surrounding wall is in a rectangular shape, and said reflectors are disposed at corner regions of said frame.

49. The LED packaging device of claim 48, wherein said LED packaging device comprises two of said LED chips disposed on said bottom surface in a staggered arrangement, said surrounding wall including four sidewall parts interconnected to one another, said LED chips having a difference in distance from a geometric center of each of said LED chips to one of said sidewall parts, each of said reflectors having a contact region contacting said bottom surface of said bottom wall, said contact region having a width ranging from 0.1 to 2 times of the difference in distance.

50. The LED packaging device of claim 27, wherein:

said surrounding wall is in a rectangular shape, said LED packaging device comprises two of said LED chips disposed on said bottom surface in a staggered arrangement, said surrounding wall including four sidewall parts interconnected to one another, said LED chips having a difference in distance from a geometric center of each of said LED chips to one of said sidewall parts, each of said reflectors having a contact region contacting said bottom surface of said bottom wall, said contact region having a width ranging from 0.1 to 2 times of the difference in distance, said reflectors include at least one first reflector that is disposed at one of corner regions of said frame, and at least one second reflector that is disposed on said one of said sidewall parts, and that is located between projection points of said geometric centers of said LED chips on said one of said sidewall parts, and said contact region of said at least one first reflector is larger in area than that of said at least one second reflector.

51. The LED packaging device of claim 50, wherein said contact region of said at least one first reflector has a width that ranges from 0.5 to 2 times of the difference in distance.

52. The LED packaging device of claim 50, wherein said contact region of said at least one second reflector has a width that ranges from 0.1 to 1 times of the difference in distance.

53. A light emitting diode (LED) packaging device, comprising:

a frame including a bottom wall that has a bottom surface, and a surrounding wall that extends upwardly from said bottom wall, said bottom wall and said surrounding wall cooperatively defining a mounting space, said surrounding wall having an internal side surface facing said mounting space and a top surface facing away from said bottom surface;

at least one LED chip disposed on said bottom surface and received in said mounting space;

a plurality of spaced-apart reflectors, each of which being disposed on a peripheral region of said bottom surface;

a packaging body covering said LED chip and said reflectors, such that said LED chip is sealed inside said mounting space, wherein said surrounding wall is in a rectangular shape, and said reflectors are disposed at corner regions of said frame, and wherein said LED packaging device comprises two of said LED chips disposed on said bottom surface in a staggered arrangement, said surrounding wall including four sidewall parts interconnected to one another, said LED chips having a difference in distance from a geometric center of each of said LED chips to one of said sidewall parts, each of said reflectors having a contact region contacting said bottom surface of said bottom wall, said contact region having a width ranging from 0.1 to 2 times of the difference in distance.

54. The LED packaging device of claim 53, wherein said bottom surface of said bottom wall has a surface undulation that is not greater than 10 µm.

55. The LED packaging device of claim 53, wherein each of said reflectors is in contact with said internal side surface and protrudes from said internal side surface of said surrounding wall.

56. The LED packaging device of claim 53, wherein each of said reflectors has a reflectance larger than that of said internal side surface of said surrounding wall.

57. The LED packaging device of claim 53, wherein each of said reflectors has a reflectance that is equal to or greater than 90%.

58. The LED packaging device of claim 53, wherein each of said reflectors is made of a material selected from the group consisting of reflective silica gel, reflective resin, and a combination thereof.

59. The LED packaging device of claim 53, wherein each of said reflectors is apart from said LED chip by a first minimum distance which is equal to or greater than 50 µm.

60. The LED packaging device of claim 53, wherein each of said reflectors is apart from said LED chip by a first minimum distance, and said LED chip is apart from said internal side surface of said surrounding wall by a second minimum distance, the first minimum distance ranging from 0.3 to 1.3 times of the second minimum distance.

61. The LED packaging device of claim 53, wherein a footprint of said reflectors on said bottom surface has an area that ranges from 5% to 60% of a total area of said bottom surface.

62. The LED packaging device of claim 53, wherein each of said reflectors is in one of a column shape and a bulk shape.

63. The LED packaging device of claim 53, wherein each of said reflectors has an inclined surface connected to and angularly extending from said bottom surface, said inclined surface and said bottom surface cooperatively defining an interior angle included therebetween which ranges from 30° to 90°.

64. The LED packaging device of claim 53, wherein said reflectors are formed by a process selected from the group consisting of dispensing, jetting and screen printing.

65. The LED packaging device of claim 53, wherein each of said reflectors is made of a material different from that of said bottom wall of said frame.

66. The LED packaging device of claim 53, wherein each of said reflectors is made of a material different from that of said surrounding wall of said frame.

67. The LED packaging device of claim 53, wherein said frame is made of a material selected from the group consisting of an epoxy molding compound (EMC), a polyphthalamide (PPA), a poly(1,4-cyclohexylene dimethylene terephthalate)(PCT), a ceramic material, and combinations thereof.

68. The LED packaging device of claim 53, wherein said at least one LED chip is selected from the group consisting of a flip-chip LED chip, a vertical LED chip, and a horizontal LED chip.

69. The LED packaging device of claim 53, wherein each of said reflectors is spaced apart from said at least one LED chip on said bottom surface of said bottom wall.

70. The LED packaging device of claim 53, wherein each of said reflectors has an upper surface that is distal from said bottom surface, and has a height measured from said bottom surface of said bottom wall to said upper surface that is equal to or smaller than a height of said surrounding wall measured from said bottom surface of said bottom wall to said top surface.

71. The LED packaging device of claim 70, wherein the height of each of said reflectors is equal to or greater than two thirds of the height of said surrounding wall.

72. The LED packaging device of claim 70, wherein the height of each of said reflectors ranges from 5 µm to 2000 µm.

73. The LED packaging device of claim 70, wherein said at least one LED chip includes a first semiconductor layer, a second semiconductor layer, and a light emitting layer disposed between said first semiconductor layer and said second semiconductor layer, and wherein the height of each of said reflectors is equal to or greater than a height measured from said bottom surface of said bottom wall to said light emitting layer.

* * * * *